United States Patent [19]

Woolf et al.

[11] Patent Number: 4,647,888
[45] Date of Patent: Mar. 3, 1987

[54] HIGH HEAT CAPACITY COMPOSITES FOR A SUPERCONDUCTOR

[75] Inventors: Lawrence D. Woolf, Carlsbad; John R. Purcell, San Diego, both of Calif.

[73] Assignee: GA Technologies Inc., San Diego, Calif.

[21] Appl. No.: 732,518

[22] Filed: May 9, 1985

[51] Int. Cl.⁴ .............................................. H01F 7/22
[52] U.S. Cl. .................................. 335/216; 174/126 S
[58] Field of Search .............................. 335/216, 299; 174/126 S, 128 S

[56] References Cited

U.S. PATENT DOCUMENTS

| | | | |
|---|---|---|---|
| 3,109,745 | 11/1963 | Begany et al. | 117/5.3 |
| 3,766,502 | 10/1973 | Bronca et al. | 335/216 |
| 3,983,521 | 9/1976 | Furuto et al. | 335/216 |
| 4,171,464 | 10/1979 | Steyert, Jr. | 174/126 |
| 4,190,817 | 2/1980 | Rabinowitz | 335/216 |
| 4,195,199 | 3/1980 | Hillmann et al. | 335/216 |

FOREIGN PATENT DOCUMENTS 55-62708  11/1978  Japan .................................. 335/216

*Primary Examiner*—George Harris
*Attorney, Agent, or Firm*—Fitch, Even, Tabin & Flannery

[57] ABSTRACT

To thermally stabilize superconductors that are potted in a polymeric material, such as is common in superconducting coils, materials having extremely high heat capacities at the superconducting temperatures are incorporated into the potting material. The heat-absorbing material may have an extremely high heat capacity at superconducting temperatures due to magnetic orderings it undergoes at superconducting temperatures or may be a heavy fermion material having electrons with effective masses greatly exceeding the bare electron mass.

16 Claims, 6 Drawing Figures

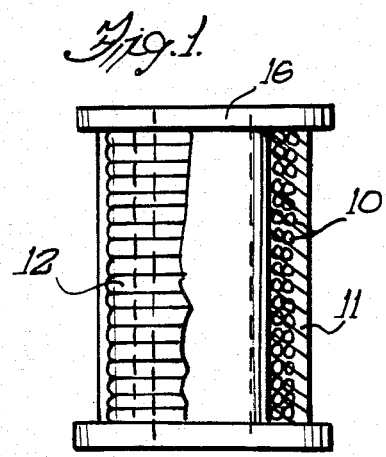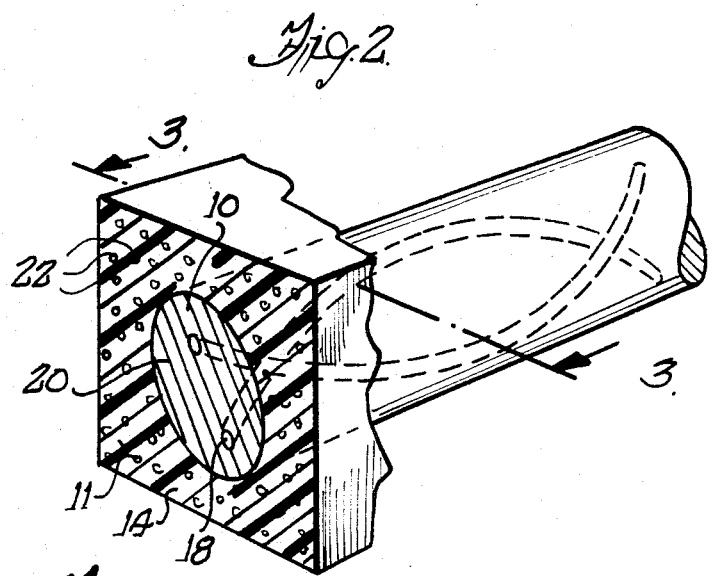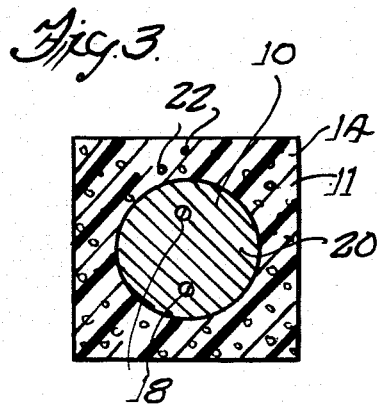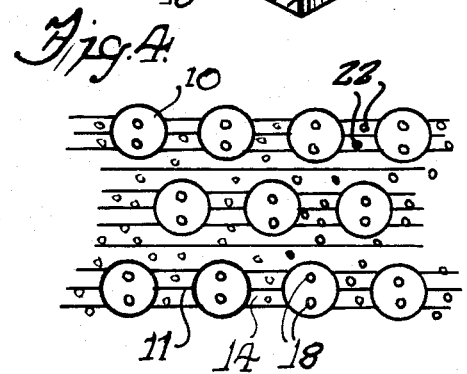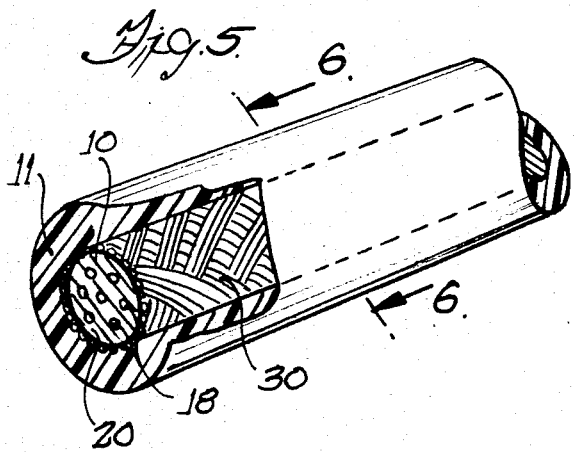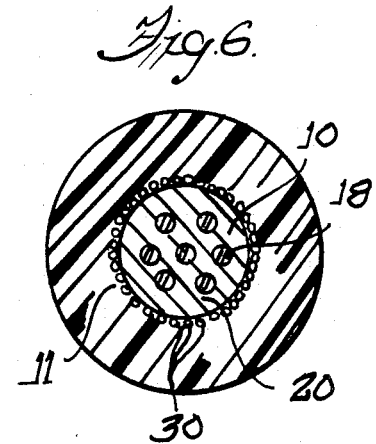

HIGH HEAT CAPACITY COMPOSITES FOR A SUPERCONDUCTOR

The present invention relates generally to superconductors and more particularly to materials used for thermally stabilizing superconductors.

BACKGROUND OF THE INVENTION

In superconductor magnets, variations in magnetic fields are common occurrences which often cause conduction faults in superconducting filaments. To compensate for such conducting faults, the magnetic windings are usually formed of wires in which the filaments of superconducting material are clad in a stabilizer metal, such as silver, copper or aluminum, which is normally conductive across a wide range of temperatures, including superconducting temperatures. The metal electrically stabilizes the wire by shunting any portion of the filament(s) which has become nonconducting. Furthermore, the encasing metal has good thermal conductivity, tending to transfer heat away from hot spots in the windings. Nevertheless, events, such as flux jumps, wire motion or eddy currents in the encasing metal produce heat which may in certain circumstances lead to a precipitous normalization of superconductive windings. Such temperature excursions occur during periods measured in microseconds, such short periods often being insufficient for dissipation of the heat to the coolant, e.g., liquid helium.

To reduce the probability of normalizing temperature excursions, U.S. Pat. No. 4,171,464 proposes that particles or fibers of gadolinium oxide or gadolinium-aluminum oxide be incorporated in the metal, e.g., copper, that encases the superconducting filaments. These materials have high heat capacities at superconducting temperatures, e.g., below about 5° K., and thus tend to absorb locally produced heat.

Incorporation of heat-absorbing particulates in the stabilizing metal is advantageous in that a large interface is produced between the metal stabilizer and the high heat capacity material. On the other hand, incorporation of the high heat capacity material into the stabilizing metal presents some problems. To begin with, inclusion of high heat capacity material, in either fiber or particulate form, adds to the expense of forming the superconductor.

The inclusion of heat-absorbing material in the metal stabilizer reduces the conductivity of the metal stabilizer in at least two ways, thereby making the metal a less efficient electrical stabilizer. First of all, the high heat capacity heat-absorbing material is substantially nonconducting, and by occupying volume which would otherwise be occupied by the metal, the shunting effect of the stabilizer is reduced. Secondly, trace solubilization of the heat-absorbing material into the stabilizer metal reduces the conductivity of the metal. In superconductors, very pure metals are used as stabilizers so as to have maximum conductivity. Although the heat-absorbing material is included in the stabilizer metal in insolubilized form, the process by which heat-absorbing material is incorporated in the stabilizer metal generally results in some trace solubilization of the material into the metal, which trace solubilization significantly affects the electrical characteristics of the stabilizer metal.

The need continues for more effective means to thermally stabilize superconductors.

SUMMARY OF THE INVENTION

Superconducting coils, such as those used in superconducting magnets, are typically comprised of windings of superconductors potted in material, such as epoxy, which prevents motion in large applied magnetic fields. The superconductor includes at least one and generally a plurality of superconductive filaments surrounded by a cladding of electrical stabilizer that is highly conductive normal metal, such as silver, copper or aluminum. To thermally stabilize the superconductor in accordance with the invention, material having extremely high heat capacities at the superconducting temperatures are incorporated in the potting material.

BRIEF DESCRIPTION OF THE DRAWINGS

FIG. 1 is an elevation view, partially cut away, of a superconducting coil, embodying various features of the invention;

FIG. 2 is an enlarged perspective view of a superconductor strand, such as may be wound to form the coil of FIG. 1;

FIG. 3 is a cross-sectional view taken along line 3—3 of FIG. 2;

FIG. 4 is a cross-sectional view taken along line 4—4 of FIG. 1;

FIG. 5 is a cut-away perspective view of an alternate embodiment of a superconductor, including superconducting filaments, surrounding potting material and fibrous thermal stabilizing material; and FIG. 6 is a cross-sectional view taken along line 6—6 of FIG. 5.

DETAILED DESCRIPTION OF THE PREFERRED EMBODIMENTS

The invention provides a superconducting coil 12 (FIG. 1) in which a superconductor 10 is potted in a composite matrix 11, the superconductor comprising between about 40% and about 80% of the total volume occupied by the superconductor and potting matrix. The superconductor 10 comprises superconducting filaments embedded in normally conductive metal 20, the filaments comprising between about 10 and about 50 volume percent of the superconductor. The composite potting matrix 11 comprises a dielectrical material 14 and heat-absorbing material 22 selected from the group consisting of magnetic ordering transition materials and heavy fermion materials, with the heat-absorbing material comprising between about 5 and about 70 volume percent of the potting matrix.

Superconducting coils 12, such as those used in superconducting magnets, generally include a winding of a superconductor 10 and surrounding dielectrical material in which the winding is potted. In FIG. 1, the superconductor 10 is wound in spiral about a bobbin 16. The superconductor 10, as seen in FIGS. 2 and 3, itself comprises at least one, and generally a plurality of superconducting filaments 18 and a cladding 20 of stabilizer metal that is highly conductive and which electrically shunts any portion of the filament 18 or filaments which normalizes and thus becomes nonconducting. The dielectric material 14 of the potting matrix 11 prevents motion in large applied magnetic fields, which motion would cause the coil to quench.

The cladding material 20 is a metal with high normal conductivity, even at superconducting temperatures. Typically the cladding metal 20 is selected from copper, aluminum or silver and is preferably in very pure form to enhance its conductivity. The superconducting filaments 18 are selected from known superconducting materials, such as NbTi, Nb$_3$Sn, Nb$_3$Ge and Nb$_3$Al, but may be selected from among new superconducting materials as they are developed.

As mentioned above, a number of events, such as flux jumps, wire motion or eddy currents in the stabilizer metal produce localized heat. If not dissipated sufficiently rapidly, the heat may lead to precipitous normalization of superconducting windings.

In accordance with the invention, materials 22 which have extremely high heat capacities at superconducting temperatures, e.g., below about 10° K., and therefore are very efficient absorbers of heat, are dispersed in the dielectric material 14 for the purpose of absorbing locally generated heat before precipitous normalization can occur. The potting matrix 11 is in intimate contact with the superconductor, and therefore, there is rapid heat transfer from the superconductor 10 to the heat-absorbing material 22 in the potting matrix 11.

The dielectric material 14 is a polymeric material which preferably has good strength characteristics at the superconducting temperature range in which it is used. Typically the potting material is an epoxy, such as Shell 828. Other suitable potting materials include, but are not limited to Shell 815. Preferably in the superconducting temperature range which the dielectric material is to be subjected, it has a flexural modulus of at least about $10^6$ psi and a tensile strength of at least about 5,000 psi.

The high heat capacity material 22 that is used for stabilization is generally in particulate form, preferably less than 100 standard U.S. mesh.

The amount of the particulate heat-absorbing material 22 that is added to the dielectric material 14 is primarily determined by the amount of thermal stabilization required. This will depend upon the particular superconducting system and how much localized heating is expected to be generated thereby as well as the heat capacity and other stabilizing properties of the heat-absorbing material itself. The potting matrix 11 must maintain its structural integrity, and this determines the upper limit of the amount of heat-absorbing material that can be included in the dielectric material 14. Typically, the heat-absorbing material comprises between about 5 and about 70 volume percent of the potting matrix 11. Generally, it is preferable to provide the heat-absorbing material in as high a volume percent as possible to maximize heat transfer from the cladding metal 20 to the heat-absorbing material 22, and it is particularly desirable to provide as high a volume percent of heat-absorbing material at the interface between the superconductor 10 and the matrix 11. Of course, the thicker the potting matrix 11 that contains the heat-absorbing material, the greater heat capacity the potting matrix will provide; however, merely making the potting matrix thicker may not add substantial thermal stability to the superconductor 10 because heat transfer must be very rapid in order to prevent precipitous normalization, and heat transfer to remote portions of the potting matrix may not significantly add to the thermal stability of the superconductor.

The heat-absorbing material 22 and the dielectric material 14 may have a substantially different coefficient of thermal expansion than that of the dielectric material. This effect is minimized by dispersing the heat-absorbing material uniformly throughout the dielectric material to prevent the thermal expansion effect from accumulating.

As an alternative to adding the heat-absorbing material 22 in particulate form to the potting matrix, in cases where the heat-absorbing material may be manufactured in fiber form, fibers 30 of the heat-absorbing material may be embedded in the dielectric material 14 running along the superconductor. Illustrated in FIG. 5 is fibrous heat-absorbing material 30 that is spiralled around the superconductor 10 and the dielectric material 14 then overlaid around the spiralled fiber, impregnating the fiber and holding the fiber closely adjacent to the superconductor. This arrangement has the advantage relative to dispersing particulates in the potting material in that it can place more of the heat-absorbing material closer to the superconductor, and thereby effect more rapid heat transfer. Of course, it can only be used when the heat-absorbing material is such that can be provided into fiber form. The utilization of a fiber heat-absorbing composite structure may serve to enhance the mechanical strength of the resulting superconducting composite structure.

The materials that are selected for their heat-absorbing properties have high heat capacities at superconducting temperatures which are at least about two and preferably three orders of magnitude greater than that of copper, the most commonly used electrical stabilizer. While at ordinary temperatures, materials having such enormously elevated heat capacities are not available, at temperatures approaching 0° K., various phenomena may contribute to extraordinary heat capacities.

In general, the heat capacity C(T) of a magnetic material at low temperatures may be written as $$C(T) = C_e(T) + C_L(T) + C_M(T) + C_{CEF}(T).$$

In this equation, C(T) is the total heat capacity. $C_e(T) = \gamma T$ is the contribution arising from the conduction electrons and is called the electronic constant or the Sommerfeld constant. $C_L(T)$ is due to lattice vibrations or phonons and at low temperatures $C_L(T) = \beta T^3$ where $\beta = 12\pi^{-4}R/5\theta_D^3$ and R is the molar gas constant and $\theta_D$ is the Debye temperature. $C_M(T)$ represents the magnetic contributions to the heat capacity and is large in the vicinity of magnetic ordering transitions. The $C_{CEF}(T)$ term arises from the crystalline electric field due to the ions surrounding the magnetic ion splitting the Hund's rule ground state multiplet of the magnetic ion and causes a "Schottky anomaly". The $C_e(T)$ and $C_L(T)$ terms are relatively independent of applied magnetic fields, whereas the $C_M(T)$ and $C_{CEF}(T)$ terms can be greatly affected by applied magnetic fields. In general, both $\gamma$ and $\beta$ (or $\theta_D$) are independent of temperature.

One type of heat-absorbing material which can be included in the potting material is the type taught in U.S. Pat. No. 4,171,464 which undergo magnetic ordering transitions in the superconducting temperature range. These are referred to herein as magnetic ordering transition materials. The high capacity of these compounds is primarily attributable to the $C_M(T)$ and $C_{CEF}(T)$ components of heat capacity. For example in GdAlO$_3$, an antiferromagnetic transition at 3.7° K. is responsible for its high heat capacity at around the temperature of liquid helium (4.2° K. at atmospheric pressure) and in Gd$_2$O$_3$, a complex combination of crystalline field splitting effects and long range order effects are responsible for the high heat capacity in the temperature range of liquid helium.

The heat capacities of heat-absorbing materials, which at superconducting temperatures have extraordinarily high heat capacities attributable to magnetic ordering transitions, decrease with increasing magnetic fields. As described in the '464 patent, this property may be used advantageously in stabilizing superconductors in relatively intense magnetic fields, e.g., 2.4 Tesla, in that when a decrease in the effective magnetic field occurs which may result from partial normalization of the coil, the corresponding increase in heat capacity of the material effects an adiabatic thermal stabilization.

On the other hand, this adiabatic thermal stabilization occurs only when the heat-absorbing material actually "feels" a decrease in a magnetic field. If the heat-absorbing material is not so situated as to feel a decrease in magnetic field upon partial normalization of the coil, the adiabatic thermal stabilization will not occur. Thus, in many cases where the superconducting coil is used in a high magnetic field application, it would be much more desirable to have a heat-absorbing material that has a heat capacity which is substantially unaffected by the intensity of the magnetic field. This is particularly true in fusion applications where magnetic fields up to about 15 Tesla are generated.

A class of materials which have extraordinarily high heat capacities in the superconducting temperature range is the heavy fermion materials (HFM) also known as strongly interacting Fermi liquid materials. HFM or strongly interacting Fermi liquid materials are binary $(A_xB_y)$, ternary $(A_xB_yC_z)$, pseudobinary $(A_{1-x}B_xC_y)$ or pseudoternary $(A_{1-x}B_xC_yD_z)$ compounds which all include either a rare earth element or an actinide element. Cerium is the most common rare earth element in these compounds, and uranium is the most common actinide element. HFM have f-electron systems with highly correlated electrons having effective masses about 200 times the bare electron masses at temperatures approaching 0° K., e.g., below about 10° K.

HFM have heat capacities below 10° K. which exceed that of copper by two to three orders of magnitude or more, whereby relatively small amounts of these materials can afford very significant thermal stability to a low temperature system.

Some HFM materials have been of recent interest in that they become superconducting at extremely low temperatures, e.g., below about 1° K., and as superconductors have unique properties. However, the present invention is not concerned with the superconducting properties of heavy fermion materials but with another unique property of these materials, that is, the extremely high heat capacity of these materials at very low temperatures. This property allows these materials to absorb substantial quantities of heat and thereby efficiently thermally stabilize systems at temperatures below about 25° K. and particularly at temperatures below about 10° K. In most applications, in fact, the temperature will be between about 1.5° K. and 4.2° K. (the temperature of liquid helium at one atmosphere), a range which is above the temperature where the heavy fermion superconductors become superconducting themselves. At higher temperatures, the heat capacity of heavy fermion materials drops off due to a reduction in their effective electron masses; however, for purposes of this invention, heavy fermion material is generally useful up to the temperature whereat the effective electron mass is about 25 times the bare electron mass.

That is, for thermally stabilizing a superconducting filament according to the present invention, the heat-absorbing material should have an effective electron mass at least about 25 times and preferably about 100 times the bare electron mass at the critical temperature whereat the filament becomes superconducting or if the filament is maintained at a lower temperature, the heat-absorbing material should have such an elevated effective electron mass at the maintenance temperature.

Heavy fermion materials not only have unusually high heat capacities below 10° K., but the high heat capacities are substantially unaffected by the magnetic field. Thus these materials are useful for absorbing heat in the presence of very large magnetic fields.

HFM derive their high heat capacities primarily from a very high $C_e(T)$ which is substantially unaffected by magnetic field. The remaining three contributions, i.e., $C_L(T)$, $C_M(T)$ and $C_{CEF}(T)$ are relatively minor contributors to the total heat capacities of HFM. Thus, HFM are useful for absorbing large quantities of heat, regardless of the magnetic field which they experience. It has been demonstrated that the heat capacity of these materials is substantially unaffected at temperatures above 0.05° K. Of course, these materials do not provide substantial adiabatic-stability, but their extremely high heat capacities act very efficiently to thermally stabilize material in the under 10° K. temperature range by absorbing very substantial quantities of heat.

$C_e(T)$, which is the major contribution to total heat capacity in HFM is a product of the specific heat coefficient, $\gamma$, attributable to conducting electrons times the absolute temperature. In HFS material, $\gamma$ ranges from about 50 to 2000 mJ/mole-$K^2$ at 0° K. This is from about two orders of magnitude to upwards of three orders of magnitude above copper, which has a specific heat coefficient, $\gamma$, of 0.69 mJ/mole-$K^2$.

$\gamma$ values for several useful HFM compositions at 0° K. are given in the table below.

| HFS MATERIAL | $\gamma$(0° K.) (mJ/mole-$K^2$) |
| --- | --- |
| $CeAl_3$ | 1600 |
| $CeCu_2Si_2$ | 1400 |
| $UBe_{13}$ | 1100 |
| $U_6Fe$ | 150 |
| $CeCu_6$ | 1600 |
| $U_2Zn_{17}$ | 395–1070 |

Although $\gamma$ decreases with increasing temperature (T) due to progressive decrease in the effective electron mass, all of the HFM have extraordinarily high heat capacities through the 0° to 10° K. temperature range, and in some cases these materials provide substantial thermal stabilization up to about 25° K.

For thermally stabilizing a system it is preferred to select a HFM having a $\gamma$ (0° K.) value of at least 150, and more preferably above about 1000 mJ/mole-$K^2$.

Whether the heat-absorbing material derives its high heat capacity from magnetic ordering transitions or from conduction electrons, the total heat capacity greatly exceeds that of copper or other material, such as silver or aluminum, which are used as stabilizers. Thus even a relatively small amount of such material, as compared to the amount of stabilizer, will substantially contribute to the total heat capacity of the coil.

Several advantages of the invention can now be more fully appreciated. The inclusion of materials having extraordinarily high heat capacities in the potting material around a superconductor substantially enhances the heat capacity and thereby the thermal stability of the superconducting coil. Because the heat-absorbing material is in the potting material rather than the stabilizer, it does not add to the cost of producing the superconductor itself and does not adversely affect the electrical characteristics of the superconductor itself. Because the potting material is in intimate contrast with the stabilizer, there is rapid heat transfer from the superconductor to the potting material with its enhanced heat capacity provided by the included heat-absorbing material. Accordingly, potting material that includes high heat capacity material as a heat sink, contributes greatly to the thermal stability of the coil, helping to prevent precipitous normalization.

While the invention has been described in terms of certain preferred embodiments, modifications obvious to one with ordinary skill in the art may be made without departing from the scope of the invention.

Various features of the invention are set forth in the following claims.

What is claimed is:

1. Composite potting material for a superconductor comprising a polymeric dielectric material stable at temperatures below about 25° K. and heat-absorbing material, selected from the group consisting of heavy fermion materials, magnetic ordering transition materials and mixtures thereof, contained within said polymeric material having a heat capacity at temperatures below about 25° K. at least about two orders of magnitude greater than copper.

2. Composite potting material according to claim 1 wherein said heat-absorbing material is selected from the group consisting of gadolinium oxide and gadolinium aluminum oxides.

3. Composite material according to claim 1 wherein said heat-absorbing material is in particulate form and dispersed within said polymeric material.

4. Composite material according to claim 1 wherein said heat-absorbing material is fibers encased within said polymeric material.

5. Composite material according to claim 1 wherein said heat-absorbing material comprises between about 5 and about 70 volume percent of said composite material.

6. Composite material according to claim 1 wherein said heat absorbing material is selected from the group consisting of $CeAl_3$, $CeCu_2Si_2$, $UBe_{13}$, $U_6Fe$, $CeCu_6$ and $U_2Zn_{17}$.

7. Composite material according to claim 1 wherein said dielectric polymeric material has a flexural modulus of at least about $10^6$ psi in the superconducting temperature range to which it is to be subjected.

8. Composite material according to claim 1 wherein said dielectric polymeric material has a tensile strength of at least about 5,000 psi in the superconducting temperature range to which it is to be subjected.

9. A superconducting coil comprising a superconductor wound in a spiral configuration, said superconductor having one or more superconducting filaments and a stabilizer metal cladding said superconducting filament, said wound superconductor being potted in a composite matrix comprising a polymeric dielectric material stable at temperatures below about 25° K. and heat-absorbing material, selected from the group consisting of heavy fermion superconducting materials, magnetic ordering transition materials and mixtures thereof, contained within said polymeric dielectric material, said heat-absorbing material having a heat capacity at temperatures below about 25° K. at least about two orders of magnitude greater than copper.

10. A superconducting coil according to claim 9 wherein said heat-absorbing material is selected from the group consisting of gadolinium oxide and gadolinium aluminum oxides.

11. A superconducting coil according to claim 9 wherein said heat-absorbing material is selected from the group consisting of $CeAl_3$, $CeCu_2Si_2$, $UBe_{13}$, $U_6CeCu_6$ and $U_2Zn_{17}$.

12. A superconducting coil according to claim 9 wherein said heat-absorbing material comprises between about 5 and about 70 volume percent of said composite material.

13. A superconducting coil according to claim 9 wherein said heat-absorbing material is in particulate form and dispersed within said polymeric material.

14. A superconducting coil according to claim 9 wherein said heat-absorbing material is fibers encased within said polymeric material.

15. A superconducting coil according to claim 9 wherein said polymeric dielectric material has a flexural modulus of at least about $10^6$ psi in the superconducting temperature range to which it is to be subjected.

16. A superconducting coil according to claim 9 wherein said polymeric material has a tensile strength of at least about 5,000 psi in the superconducting temperature range to which it is to be subjected.

* * * * *